United States Patent
Kameoka

(10) Patent No.: US 11,522,519 B2
(45) Date of Patent: Dec. 6, 2022

(54) TRANSMIT FILTER CIRCUIT AND COMPOSITE FILTER DEVICE

(71) Applicant: Murata Manufacturing Co., Ltd., Nagaokakyo (JP)

(72) Inventor: Yoshinori Kameoka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 250 days.

(21) Appl. No.: 16/898,596

(22) Filed: Jun. 11, 2020

(65) Prior Publication Data

US 2021/0013870 A1   Jan. 14, 2021

(30) Foreign Application Priority Data

Jul. 12, 2019 (JP) .............................. JP2019-130151
Jan. 16, 2020 (JP) .............................. JP2020-005185

(51) Int. Cl.
*H03H 9/60* (2006.01)
*H01Q 1/50* (2006.01)
*H03H 9/58* (2006.01)

(52) U.S. Cl.
CPC .............. *H03H 9/605* (2013.01); *H01Q 1/50* (2013.01); *H03H 9/582* (2013.01)

(58) Field of Classification Search
CPC ............ H03H 9/582; H03H 9/58; H03H 9/46; H03H 9/605; H03H 9/564; H03H 9/547; H03H 9/60; H01Q 1/50
See application file for complete search history.

(56) References Cited

U.S. PATENT DOCUMENTS 6,891,449 B2 * 5/2005 Takayama ............ H03H 9/6483
333/133
2002/0140519 A1   10/2002 Takayama et al.
(Continued)

FOREIGN PATENT DOCUMENTS

JP   2001-285025 A   10/2001
JP   2008-532334 A    8/2008
(Continued)

OTHER PUBLICATIONS

Official Communication issued in corresponding Korean Patent Application No. 10-2020-0084087, dated Jan. 11, 2022.

*Primary Examiner* — Tuan H Nguyen
(74) *Attorney, Agent, or Firm* — Keating & Bennett, LLP

(57) ABSTRACT

A transmit filter circuit includes an input terminal, an output terminal, plural series arm resonators, and a parallel arm resonator. The input terminal receives a transmit signal. The output terminal is electrically connected to an antenna. The plural series arm resonators are electrically connected in series with each other on a line between the input and output terminals. The plural series arm resonators include first and second series arm resonators. The first series arm resonator is closest to the output terminal. The second series arm resonator is second closest to the output terminal. A first end of the parallel arm resonator is electrically connected to a node between the first and second series arm resonators. A reference potential is provided to a second end of the parallel arm resonator. The resonant frequency of the first series arm resonator is higher than that of the second series arm resonator.

24 Claims, 9 Drawing Sheets

(56) References Cited

U.S. PATENT DOCUMENTS

2008/0116993 A1\* 5/2008 Yamakawa ............ H03H 9/605
    333/32
2017/0272057 A1  9/2017 Takata
2018/0019729 A1\* 1/2018 Tsukamoto .......... H04B 1/0057

FOREIGN PATENT DOCUMENTS

| JP | 2015-073308 A | | 4/2015 | |
|---|---|---|---|---|
| KR | 10-1998-0027158 A | | 7/1998 | |
| KR | 1998-027158 | \* | 7/1998 | ............ B01D 39/20 |
| WO | 2016/088680 A1 | | 6/2016 | |

\* cited by examiner

TRANSMIT FILTER CIRCUIT AND COMPOSITE FILTER DEVICE

CROSS REFERENCE TO RELATED APPLICATIONS

This application claims the benefit of priority to Japanese Patent Application No. 2019-130151 filed on Jul. 12, 2019 and Japanese Patent Application No. 2020-005185 filed on Jan. 16, 2020. The entire contents of these applications are hereby incorporated herein by reference.

BACKGROUND OF THE INVENTION

1. Field of the Invention

The present invention relates to a transmit filter circuit and a composite filter device.

2. Description of the Related Art

In some mobile communication devices, such as cellular phones, to reduce the size of a mobile communication device, a common antenna is used for sending a transmit signal and receiving a received signal. To separate a transmit signal and a received signal from each other, a duplexer is connected to the antenna. As an example of a duplexer, International Publication No. 2016/088680 discloses a ladder filter circuit including multiple resonators having different resonant frequencies and different anti-resonant frequencies connected with each other in a ladder form. The ladder filter circuit causes a signal of a predetermined frequency band to pass therethrough and to attenuate signals in the other frequency bands.

In a resonator, interference waves having a frequency relatively close to the frequency of a transmit signal may be mixed together with the transmit signal. This may cause the occurrence of third-order intermodulation distortion, based on the transmit signal and the interference waves. For example, if the receive frequency band is higher than the transmit frequency band, the third-order intermodulation distortion may appear in the receive frequency band and become noise for a received signal, which may degrade the reception sensitivity.

The ladder filter circuit disclosed in International Publication No. 2016/088680 is not designed to handle the occurrence of third-order intermodulation distortion.

SUMMARY OF THE INVENTION

Preferred embodiments of the present invention provide transmit filter circuits and composite filter devices which are each able to regulate the occurrence of third-order intermodulation distortion.

According to a preferred embodiment of the present invention, a transmit filter circuit includes an input terminal, an output terminal, plural series arm resonators, and a parallel arm resonator. The input terminal receives a transmit signal. The output terminal is electrically connected to an antenna. The plural series arm resonators are electrically connected in series with each other on a line between the input terminal and the output terminal. The plural series arm resonators include first and second series arm resonators. The first series arm resonator is located closest to the output terminal. The second series arm resonator is second closest to the output terminal. A first end of the parallel arm resonator is electrically connected to a node between the first and second series arm resonators. A reference potential is provided to a second end of the parallel arm resonator. The resonant frequency of the first series arm resonator is higher than the resonant frequency of the second series arm resonator.

According to preferred embodiments of the present invention, transmit filter circuits and composite filter devices are provided which are each able to regulate the occurrence of third-order intermodulation distortion.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
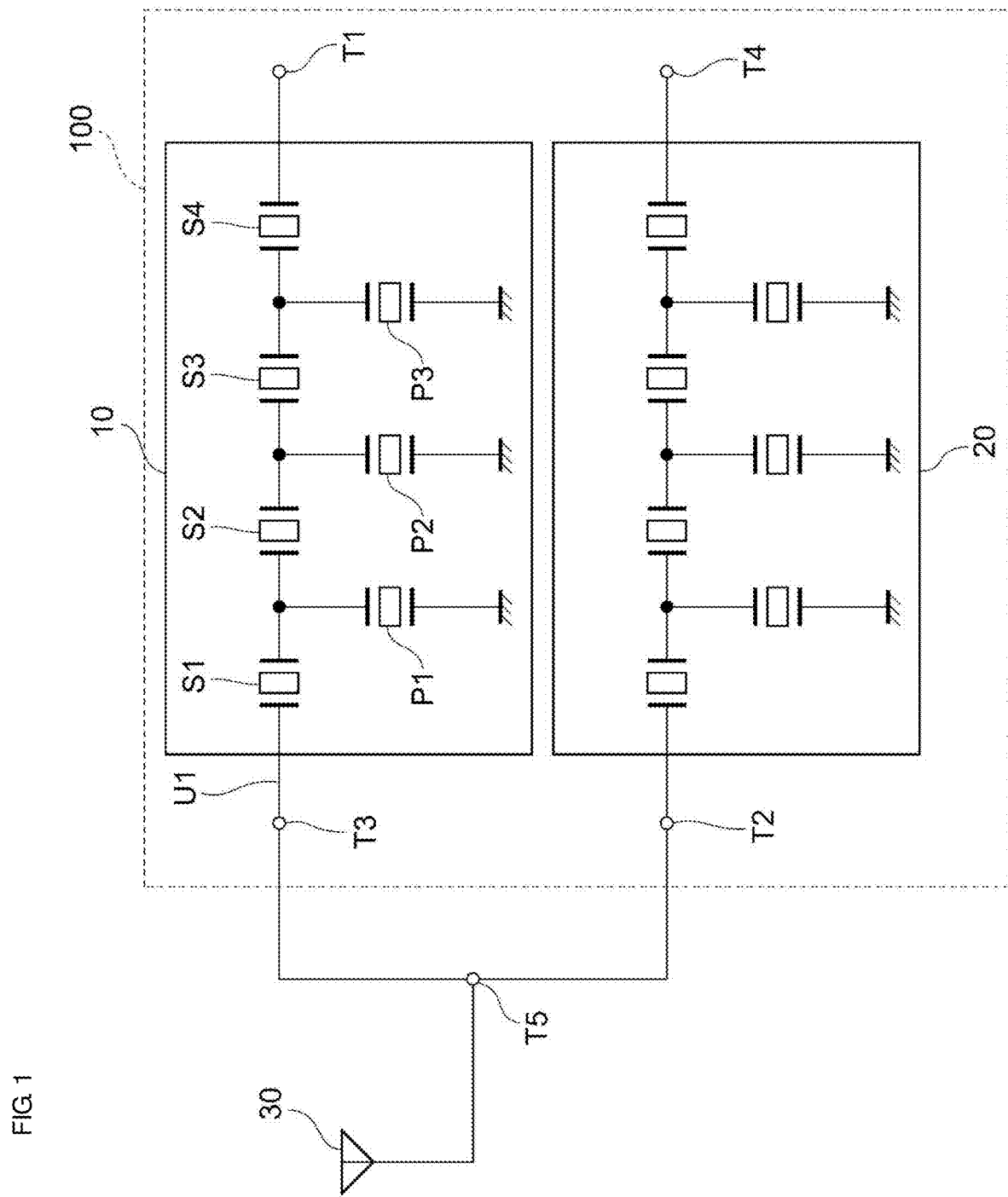
FIG. 1 is a circuit diagram showing an example of front-end circuitry including a transmit filter circuit according to a first preferred embodiment of the present invention.

Preferred embodiments of the present invention will be described below in detail with reference to the accompanying drawings. The same or similar elements are designated by like reference numerals, and an explanation thereof will not be repeated.

FIG. 1 shows an example of front-end circuitry 100 including a transmit filter circuit 10 according to a first preferred embodiment of the invention. The front-end circuitry 100 may be included in a mobile communication device, for example, a cellular phone.

As shown in FIG. 1, the front-end circuitry 100 includes the transmit filter circuit 10, a receive filter circuit 20, input terminals T1 and T2, and output terminals T3 and T4. The front-end circuitry 100 is electrically connected to an antenna 30 via an antenna terminal T5.

The transmit filter circuit 10 and the receive filter circuit 20 define a separator that separates a transmit signal and a received signal from each other. The separator, which is included in a mobile communication device that sends and receives radio frequency (RF) signals via the single antenna 30, separates a transmit signal and a received signal from each other. The separator may be a composite filter device including plural filter circuits to separate signals of multiple frequency bands from each other. Examples of the composite filter device is a duplexer including a composite of two filter circuits, a triplexer including a composite of three filter circuits, a quadplexer including a composite of four filter circuits, and an octaplexer including a composite of eight filter circuits. In the first preferred embodiment, the separator will be discussed with respect to a duplexer including two filter circuits (transmit filter circuit 10 and receive filter circuit 20).

A transmit signal output from a transmit circuit (not shown) is supplied to the transmit filter circuit 10 via the input terminal T1. The transmit filter circuit 10 passes a transmit signal of a predetermined frequency band, outputs the transmit signal of the predetermined frequency band to the output terminal T3, and attenuates transmit signals of the other frequency bands. The transmit signal passed through the transmit filter circuit 10 is sent to the antenna 30 via the output terminal T3 and the antenna terminal T5 and is further sent to a base station from the antenna 30. Instead of individually providing the output terminal T3 and the antenna terminal T5, the antenna terminal T5 may also be provided as the output terminal T3. The frequency of a transmit signal is lower than that of a received signal, which will be discussed later.

The transmit filter circuit 10 in the first preferred embodiment is a ladder filter including multiple resonators electrically connected in series with or in parallel with each other. More specifically, the transmit filter circuit 10 includes, for example, four series arm resonators S1 through S4 and three parallel arm resonators P1 through P3. The number of series arm resonators and that of parallel arm resonators are not limited to the above-described numbers. The series arm resonators S1 through S4 and the parallel arm resonators P1 through P3 are not restricted to a particular device type, and may be surface acoustic wave (SAW) filters, piezoelectric thin-film resonator filters, or bulk acoustic wave (BAW) filters, for example.

The four series arm resonators S1, S2, S3, and S4 are electrically connected in series with each other in this order in which they are located adjacent to or in a vicinity of the antenna 30. The series arm resonators S1 through S4 are provided on a line U1 electrically connecting the input terminal T1 and the output terminal T3 with each other. The parallel arm resonators P1 through P3 are electrically connected in parallel with each other in this order in which they are located closely to the antenna 30. The parallel arm resonators P1 through P3 branch off from the line U1. A first end of the parallel arm resonator P1 is electrically connected to a node between the series arm resonators S1 and S2. A first end of the parallel arm resonator P2 is electrically connected to a node between the series arm resonators S2 and S3. A first end of the parallel arm resonator P3 is electrically connected to a node between the series arm resonators S3 and S4. Second ends of the parallel arm resonators P1 through P3 are each electrically connected to a reference potential (a ground potential, for example).

A received signal received from a base station by the antenna 30 is supplied to the receive filter circuit 20 via the antenna terminal T5 and the input terminal T2. The receive filter circuit 20 passes a received signal of a predetermined frequency band to pass therethrough, outputs the received signal of the predetermined frequency band to the output terminal T4, and attenuates received signals of the other frequency bands. The received signal passed through the receive filter circuit 20 is sent to a receive circuit (not shown) via the output terminal T4. Instead of individually providing the input terminal T2 and the antenna terminal T5, the antenna terminal T5 may also be provided as the input terminal T2.

As an example of the receive filter circuit 20, a ladder filter including multiple resonators similar to that of the transmit filter circuit 10 is shown in FIG. 1. The receive filter circuit 20 is similar to the transmit filter circuit 10, and a detailed explanation thereof will be omitted. The receive filter circuit 20 is not restricted and may also include a longitudinally coupled resonator, for example.

The pass band of the transmit filter circuit 10 and that of the receive filter circuit 20 are not limited to particular bands, but are different from each other. If the front-end circuitry 100 sends and receives signals of long term evolution (LTE) Band 1, the pass band of the transmit filter circuit 10 is, for example, about 1920 MHz to about 1980 MHz, which is the transmit frequency band of Band 1, while the pass band of the receive filter circuit 20 is, for example, about 2110 MHz to about 2170 MHz, which is the receive frequency band of Band 1. Accordingly, the pass band of the receive filter circuit 20 is higher than that of the transmit filter circuit 10. The frequency band sent and received by the front-end circuitry 100 is not limited to Band 1, and may be another band, for example, Band 8, Band 26, and Band 30. The pass band of the transmit filter circuit 10 may be higher than that of the receive filter circuit 20.

The elements defining the front-end circuitry 100 may be provided on the same chip as a module or may be provided on different chips.

In addition to a transmit signal supplied from the input terminal T1, the transmit filter circuit 10 may receive, interference waves (for example, a jammer signal or the like) having frequencies relatively close to the transmit signal from the antenna 30 via the antenna terminal T5. Based on the transmit signal and the interference waves, third-order intermodulation distortion may occur in the resonators included in the transmit filter circuit 10. Third-order intermodulation distortion will be explained below with reference to FIG. 2.

Figure 2:
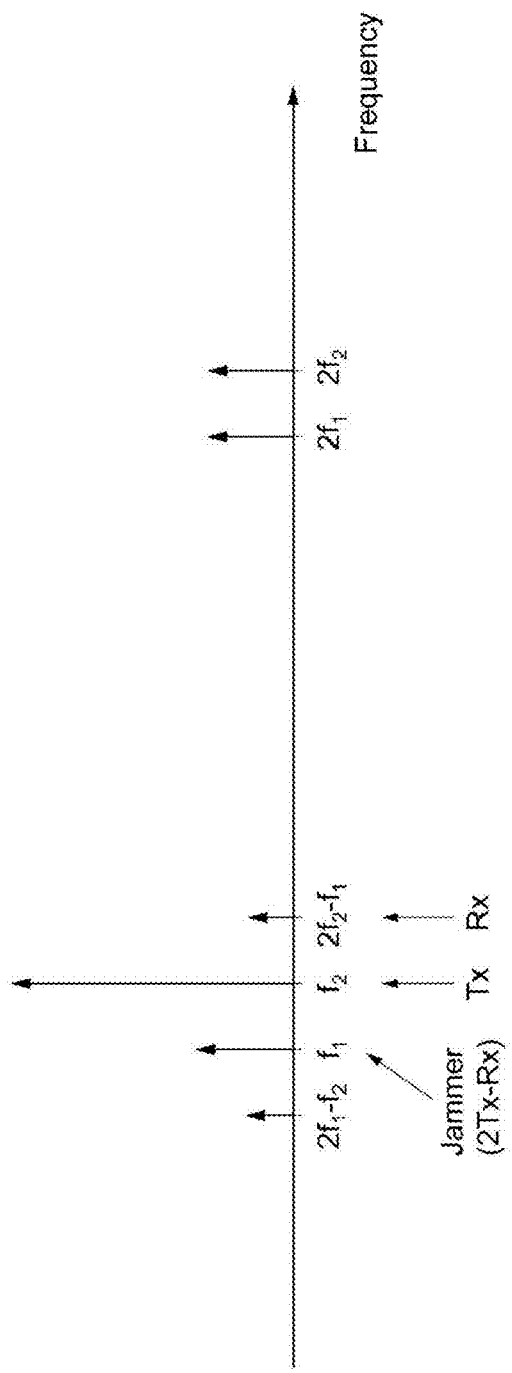
FIG. 2 is a diagram showing third-order intermodulation distortion that may occur in a resonator.

FIG. 2 is a diagram showing third-order intermodulation distortion that may occur in a resonator. Typically, when signals having relatively close frequencies, for example, a signal having a frequency $f_1$ and a signal having a frequency $f_2$ ($f_1<f_2$), are supplied to a resonator, a stress distribution of each of the signals is produced. Because of these stress distributions, stress distributions corresponding to the frequency differences between the second harmonic waves of one frequency and the other frequency ($2f_1-f_2$ and $2f_2-f_1$) are produced. One or the other of these stress distributions is extracted by the electrode of the resonator and appears as the third-order intermodulation distortion.

This will be explained by taking Band 1 as an example. It is assumed that the frequency included in the frequency band Tx (about 1920 MHz to about 1980 MHz) of a transmit signal supplied to the transmit filter circuit 10 via the input terminal T1 is $f_2$ and the frequency of interference waves output to the transmit filter circuit 10 from the antenna 30 is $f_1$. It is also assumed that the frequency $f_1$ of the interference waves is slightly lower than the frequency $f_2$ and is included in the frequency band 2Tx-Rx (about 1730 MHz to about 1790 MHz), which corresponds to the difference between the second harmonic waves of a transmit signal and the fundamental waves of a received signal.

Accordingly, the frequency ($2f_2$-$f_1$) of the third-order intermodulation distortion produced from the transmit signal and the interference waves overlaps the frequency band Rx (about 2110 MHz to about 2170 MHz) of a received signal of Band 1. A signal having this third-order intermodulation distortion is able to pass through the receive filter circuit 20 and becomes noise for a received signal. This may degrade the reception sensitivity.

In the first preferred embodiment, by adjusting the relationship between the resonant frequencies of the resonators included in the transmit filter circuit 10, the occurrence of third-order intermodulation distortion is regulated. More specifically, the transmit filter circuit 10 is designed so that, among the plural series arm resonators S1 through S4, the resonant frequency of the series arm resonator S1 (first series arm resonator) located closest to the output terminal T3 becomes higher than that of the series arm resonator S2 (second series arm resonator) that is the second closest to the output terminal T3. The resonant frequency $f_r$ of a SAW filter is expressed by $f_r=v/\lambda$ [Hz] where the pitch of an interdigital transducer (IDT) is $\lambda$ and the acoustic velocity of a piezoelectric substrate defining the SAW filter is v. Adjusting the pitch of the IDT, for example, may provide a desired resonant frequency $f_r$.

Figure 3:
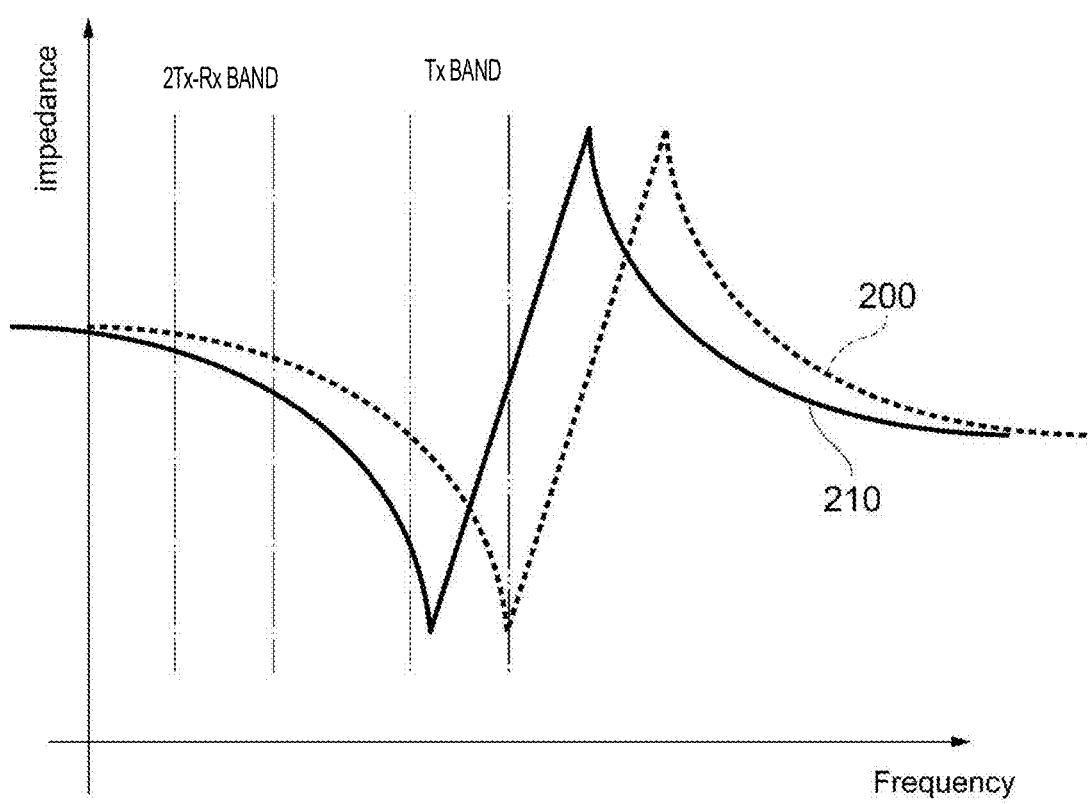
FIG. 3 is a graph showing impedance characteristics of resonators whose resonant frequencies are different from each other.

FIG. 3 is a graph showing the impedance characteristics of resonators whose resonant frequencies are different from each other. In this graph, the horizontal axis indicates the frequency, while the vertical axis indicates the impedance.

Impedance characteristics 200 of the resonator having a higher resonant frequency and impedance characteristics 210 of the resonator having a lower resonant frequency will be compared with each other. The resonators are designed so that the resonant frequency of one resonator and that of the other resonator are both located in or near the frequency band Tx of the transmit signal. Focusing on the frequency band 2Tx-Rx of interference waves that cause the third-order intermodulation distortion, the impedance of the resonator having the impedance characteristics 200 is higher than that of the resonator having the impedance characteristics 210, as shown in FIG. 3. That is, the resonator having a higher resonant frequency inhibits the interference waves to from passing through the resonator more than the resonator having a lower resonant frequency.

The interference waves entering the transmit filter circuit 10 from the antenna 30 are attenuated to some extent while passing through the multiple resonators included in the transmit filter circuit 10. Accordingly, the interference waves exhibit the highest level when passing through the resonator which is the closest to the output terminal T3 (that is, the resonator which is the closest to the antenna 30). Thus, the resonant frequency of the series arm resonator S1 located closest to the output terminal T3 is set to be higher than that of the series arm resonator S2 that is the second closest to the output terminal T3. Accordingly, the interference waves are able to be inhibited from entering the transmit filter circuit 10.

Figure 4:
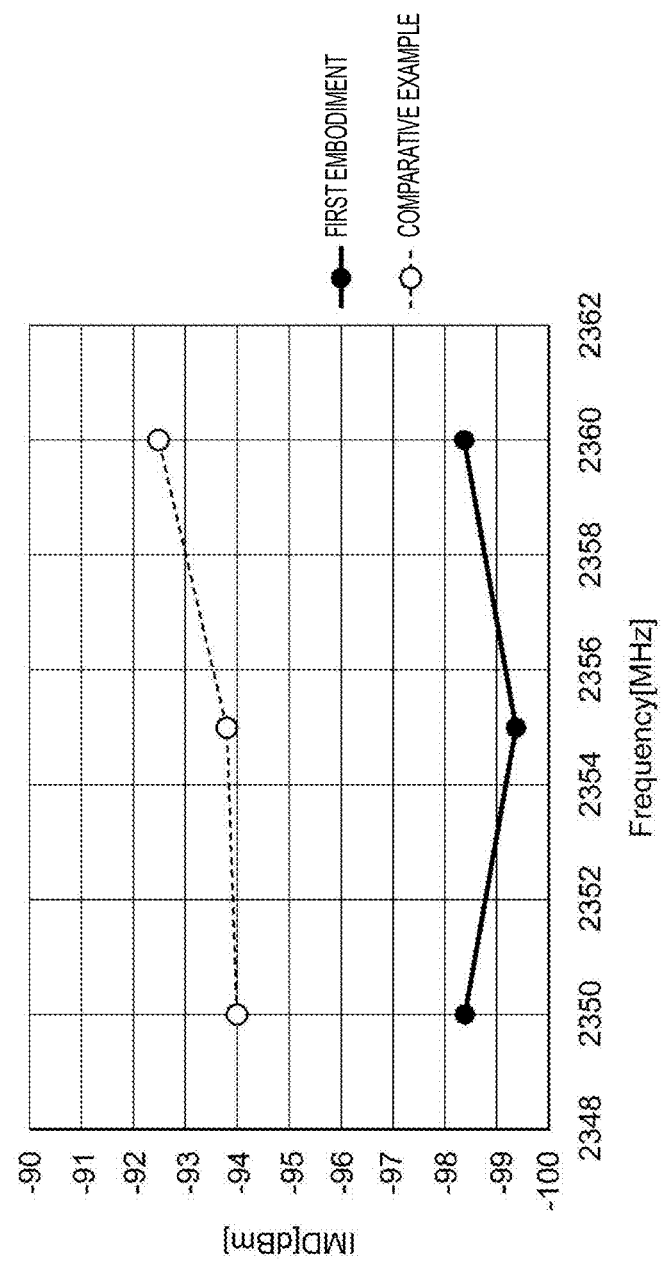
FIG. 4 is a graph showing a simulation result of the occurrence of third-order intermodulation distortion in the transmit filter circuit of the first preferred embodiment of the present invention and that of a comparative example.

FIG. 4 is a graph showing a simulation result of the occurrence of third-order intermodulation distortion in the transmit filter circuit 10 of the first preferred embodiment and that of a comparative example. In the graph, the horizontal axis indicates the frequency (MHz) of a signal, while the vertical axis indicates the third-order intermodulation distortion (IMD) (dBm). In the transmit filter circuit of the comparative example, the resonant frequency of the series arm resonator located closest to the output terminal is lower than that of the series arm resonator which is the second closest to the output terminal. In this simulation, it is assumed that the transmit filter circuit 10 of the first preferred embodiment defines a duplexer having Band 30 (transmit frequency band: about 2305 MHz to about 2315 MHz, receive frequency band: about 2350 MHz to about 2360 MHz). The resonant frequencies (MHz) of the individual resonators are shown in Table 1.

TABLE 1

| Resonator | First Preferred Embodiment | Comparative Example |
|---|---|---|
| S1 | 2319 | 2294 |
| P1 | 2274 | |
| S2 | 2294 | 2319 |
| P2 | 2233 | |
| S3 | 2521 | |
| P3 | 2230 | |
| S4 | 2269 | |

FIG. 4 shows that, in the frequency band of about 2350 MHz to about 2360 MHz, which is the receive frequency band of Band 30, the third-order intermodulation distortion in the transmit filter circuit 10 is reduced to be lower than that in the comparative example by about 4 dB to about 6 dB.

Figure 5:
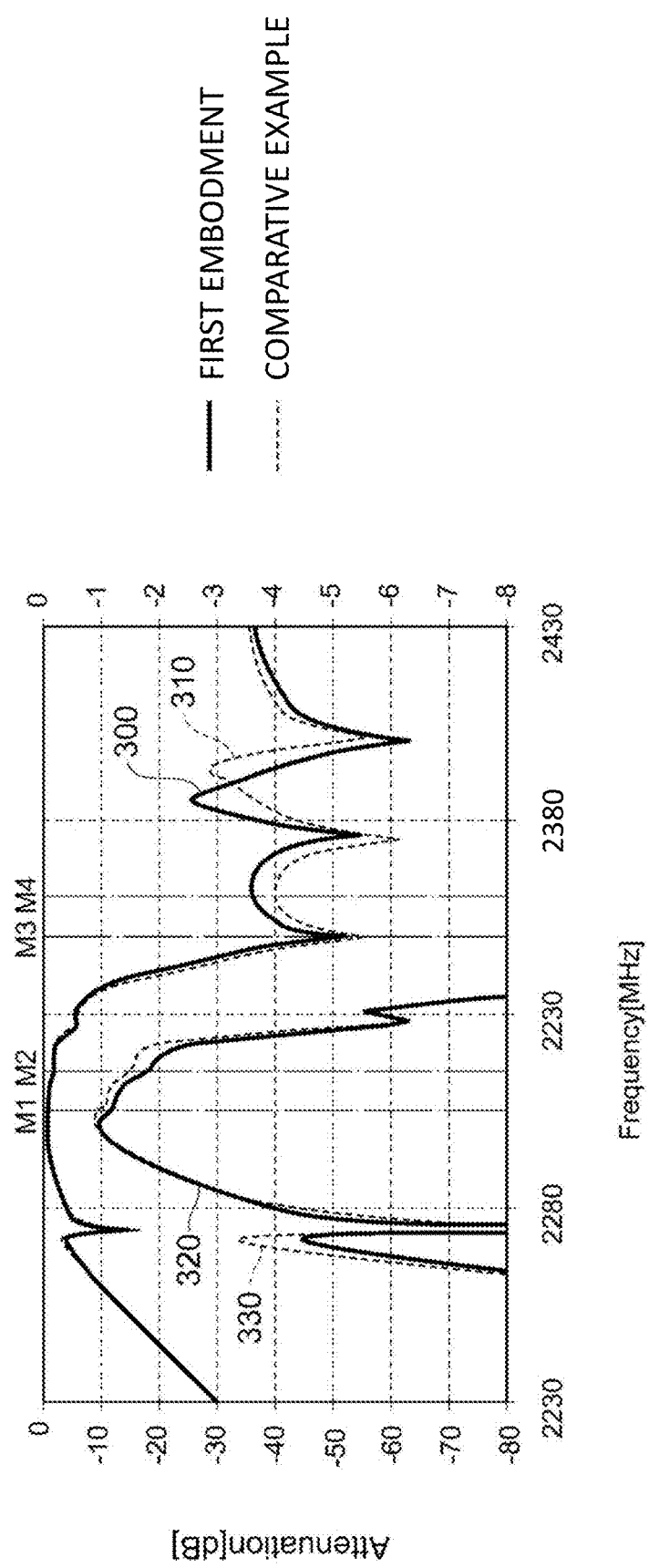
FIG. 5 is a graph showing a simulation result of attenuation characteristics of the transmit filter circuit of the first preferred embodiment of the present invention and that of the comparative example.

FIG. 5 is a graph showing a simulation result of the attenuation characteristics of the transmit filter circuit 10 of the first preferred embodiment and that of the comparative example. The conditions in this simulation are similar to those in the simulation shown in FIG. 4. In the graph, the horizontal axis indicates the frequency (MHz) of a signal, while the vertical axis indicates the attenuation characteristics (dB) of the signal. Attenuation characteristics 300 and 310 respectively represent the result of the first preferred embodiment and that of the comparative example in units of 10 dB (see the scale on the vertical axis on the left side of the graph). Attenuation characteristics 320 and 330 respectively represent the result of the first preferred embodiment and that of the comparative example in units of 1 dB (see the scale on the vertical axis on the right side of the graph). Boundary lines M1 and M2 respectively indicate the lower limit and the upper limit of the transmit frequency band in Band 30, while boundary lines M3 and M4 respectively indicate the lower limit and the upper limit of the receive frequency band in Band 30.

As seen from FIG. 5, in the transmit frequency band, which is the pass band, although a slightly greater loss is observed in the transmit filter circuit 10 of the first preferred embodiment than that in the comparative example especially in the higher frequency side, there is no considerable difference in the characteristics between the first preferred embodiment and the comparative example. Accordingly, the insertion loss in the pass band may be increased if the series arm resonator located closest to the output terminal has a higher resonant frequency than the series arm resonator which is the second closest to the output terminal. Consequently, this circuitry would not normally be employed. Nevertheless, the inventors of preferred embodiments of the present invention have found through the simulation that an increase in the insertion loss in this circuitry is negligible and does not significantly influence the transmitting of a signal, as shown in FIG. 5. In the transmit filter circuit 10 of the first preferred embodiment, the attenuation level in the receive frequency band, which is the attenuation band, is slightly lower than that in the comparative example. However, this decrease in the attenuation level is not significant, and does not significantly degrade the reception performance.

As discussed above, in the transmit filter circuit 10 of the first preferred embodiment, the resonant frequency of the series arm resonator S1 that is the closest to the output terminal T3 is higher than that of the series arm resonator S2 that is the second closest to the output terminal T3. This circuitry is able to significantly attenuate interference waves, which cause the occurrence of third-order intermodulation distortion, in the series arm resonator S1 located most closely to the output terminal T3. The occurrence of third-order intermodulation distortion is able to be regulated accordingly.

Dividing the series arm resonator located closest to the output terminal may reduce the third-order intermodulation distortion. Dividing a single series arm resonator includes replacing the series arm resonator by plural series arm resonators that are located adjacent to or in a vicinity of the adjacent parallel arm resonator. The characteristics of the combined plural series arm resonators are the same as or similar to the characteristics of the single series arm resonator. Dividing a single series arm resonator into multiple series arm resonators decreases the energy density of each resonator, which may reduce the third-order intermodulation distortion. On the other hand, however, typically, the series arm resonator located closest to the output terminal has a relatively large capacitance, which increases the circuit area if this series arm resonator is divided into multiple resonators. According to the first preferred embodiment, the series arm resonator located closest to the output terminal is not divided into multiple resonators. The occurrence of third-order intermodulation distortion is thus able to be regulated without increasing the circuit area.

The magnitude order of the resonant frequencies of the four series arm resonators S1 through S4 is not limited to a particular order. In the first preferred embodiment, the magnitude order of the resonant frequencies of the four series arm resonators S1 through S4 is in descending order of S3>S1>S2>S4. That is, the resonant frequency of the series arm resonator S3 (third series arm resonator), which is the third resonator from the output terminal T3, is higher than that of the series arm resonator S1 located closest to the output terminal T3. In other words, in the transmit filter circuit 10, the series arm resonator having the highest resonant frequency is the series arm resonator S3 positioned closer to the input terminal T1 than the series arm resonator S2, which is the second resonator from the output terminal T3, is. For example, as in Band 30, in a band in which the interval between the transmit frequency band and the receive frequency band is relatively small and whose fractional band is smaller than that of a resonator, the impedance in the pass band is likely to become inductive. In the first preferred embodiment, as a result of setting the resonant frequency of the series arm resonator S3 to be higher than the resonant frequencies of the other series arm resonators, the impedance in the pass band returns from the inductive state to the capacitive state, thereby avoiding impedance mismatching. Providing impedance matching as described above is able to reduce the signal return loss and regulate an increase in the insertion loss of the transmit filter circuit 10.

In the first preferred embodiment, the transmit filter circuit 10 is included in a duplexer. The application of the transmit filter circuit 10 is not limited to a duplexer. For example, the transmit filter circuit 10 may be provided on a chip different from a chip on which a receive filter circuit is provided. When the output terminal T3 of the transmit filter circuit 10 is electrically connected to the input terminal of the receive filter circuit via the antenna terminal T5, the third-order intermodulation distortion may occur in the resonators. The first preferred embodiment is thus able to be used in the circuitry described above.

Figure 6:
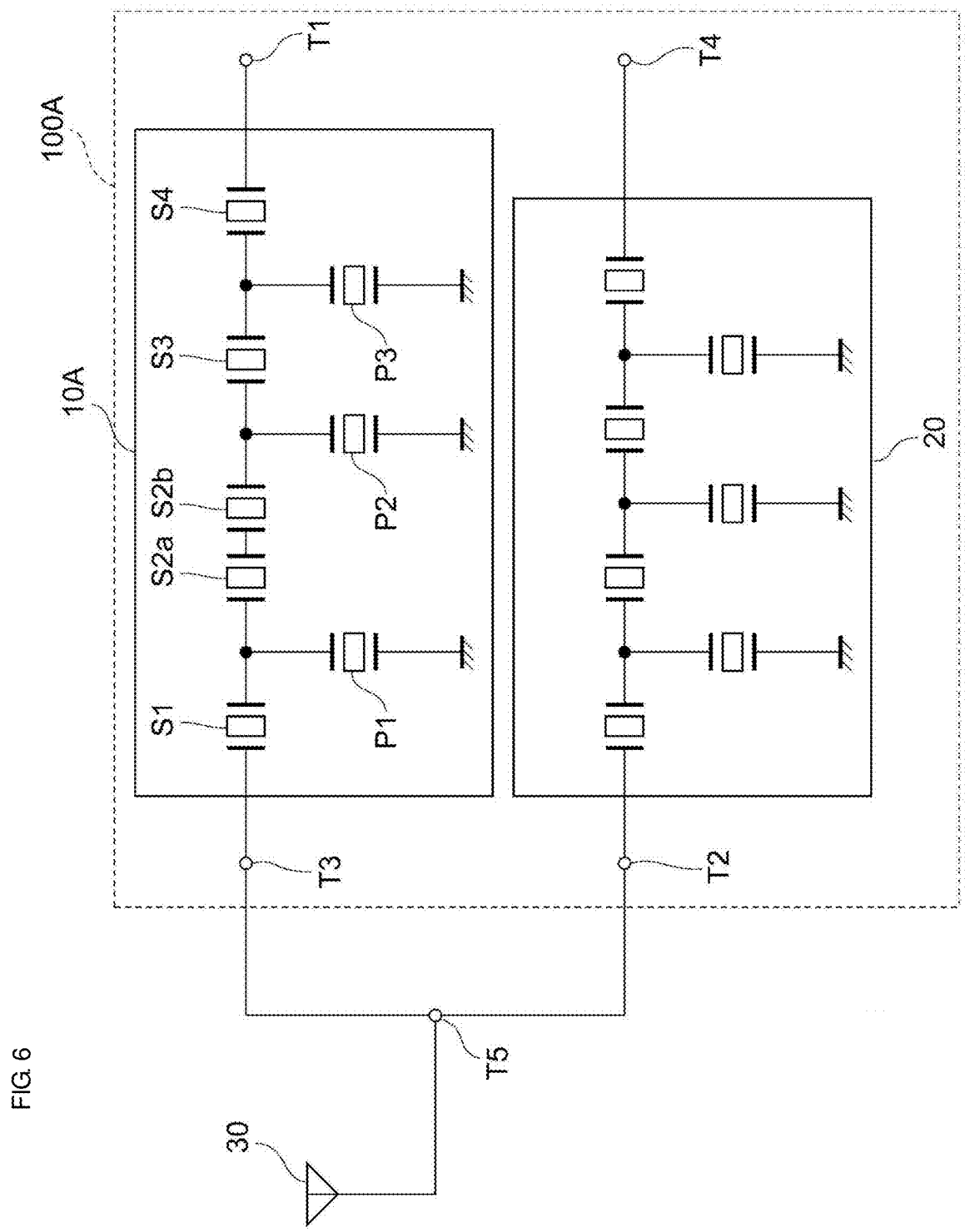
FIG. 6 is a circuit diagram showing an example of front-end circuitry including a transmit filter circuit according to a second preferred embodiment of the present invention.

FIG. 6 shows an example of front-end circuitry 100A including a transmit filter circuit 10A according to a second preferred embodiment of the invention. The second preferred embodiment will be discussed mainly by referring to points different from the first preferred embodiment while omitting the same or similar points as the first preferred embodiment. Similar advantages provided by circuitry similar to the first preferred embodiment will not be repeated.

As shown in FIG. 6, the front-end circuitry 100A is different from the front-end circuitry 100 of the first preferred embodiment in the transmit filter circuit 10A. In the transmit filter circuit 10A, instead of the series arm resonator S2, which is the second resonator from the output terminal T3, two divided series arm resonators S2a and S2b are included.

A resonator has a predetermined electrostatic capacitance. When a series arm resonator is divided into two resonators, each resonator requires twice as high as the capacitance of the series arm resonator in order to provide the same or substantially the same capacitance of the series arm resonator. The total area of the two divided resonators is accordingly four times as large as that of the series arm resonator.

When a ladder circuit is designed based on the image impedances in a two-port network, the capacitance of the series arm resonator S1 located closest to the output terminal T3 becomes larger than that of the second closest series arm resonator S2. For example, the capacitance of the series arm resonator S1 becomes about twice as high as that of the series arm resonator S2. In the second preferred embodiment, instead of the series arm resonator S1 located closest to the output terminal T3, the series arm resonator S2 that is the second closest to the output terminal T3 is divided into multiple resonators. Accordingly, the occurrence of third-order intermodulation distortion is able to be further regulated while the circuit area is not increased to as large as that in the circuitry in which the series arm resonator S1 is divided.

The series arm resonator S2 may be divided into any multiple number of resonators. Instead of or in addition to the series arm resonator S2, which is the second resonator from the output terminal T3, another series arm resonator may be divided. The series arm resonator S1 that is the closest to the output terminal T3 may also be divided as long as the resonators divided from the series arm resonator S2 are more than those divided from the series arm resonator S1.

Figure 7:
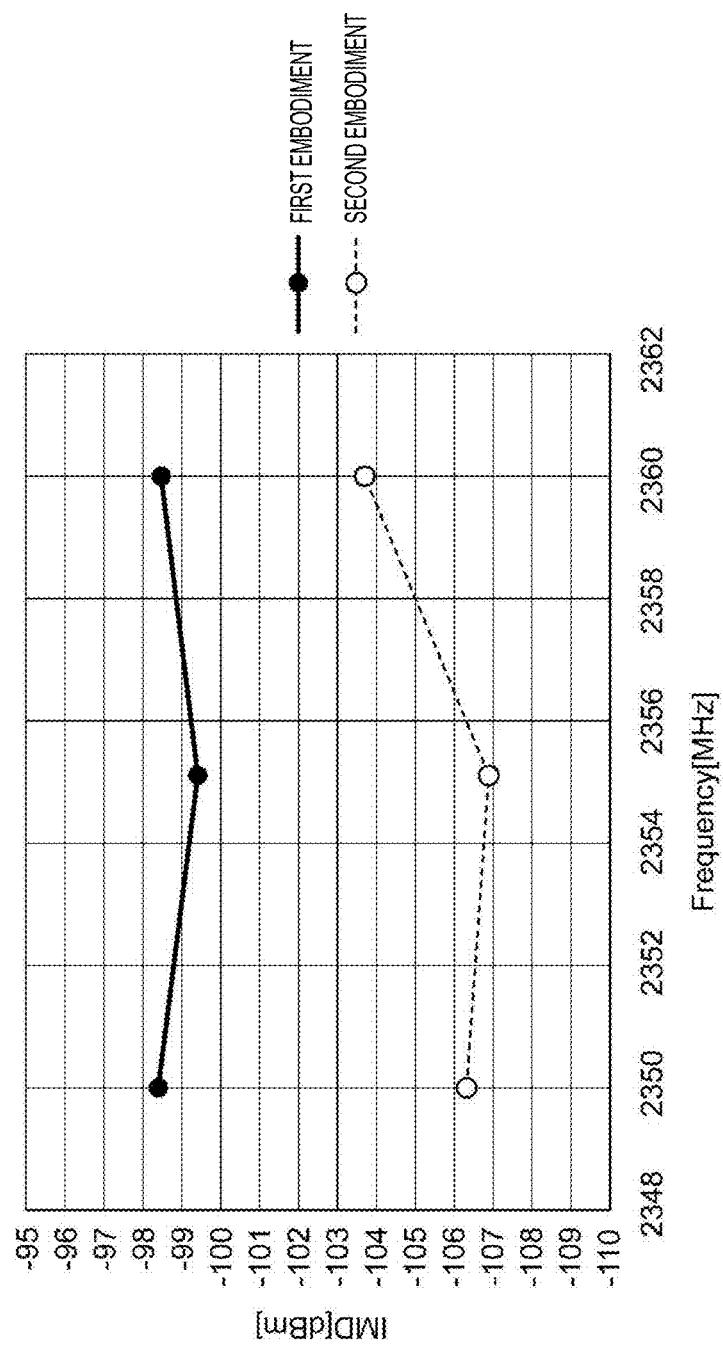
FIG. 7 is a graph showing a simulation result of the occurrence of third-order intermodulation distortion in the transmit filter circuit of the first preferred embodiment of the present invention and that of the second preferred embodiment of the present invention.

FIG. 7 is a graph showing a simulation result of the occurrence of third-order intermodulation distortion in the transmit filter circuit 10 of the first preferred embodiment and that of the transmit filter circuit 10A of the second preferred embodiment. In the graph, the horizontal axis indicates the frequency (MHz) of a signal, while the vertical axis indicates the third-order intermodulation distortion (IMD) (dBm). The frequency bands of the transmit filter circuits 10 and 10A are similar to those in the simulation shown in FIG. 4. The resonant frequencies (MHz) of the individual resonators are shown in Table 2. The resonant frequencies of the series arm resonators S2a and S2b are both about 2294 MHz.

TABLE 2

| Resonator | First Preferred Embodiment | Second Preferred Embodiment |
| --- | --- | --- |
| S1 |  | 2319 |
| P1 |  | 2274 |
| S2 (S2a, S2b) | 2294 | 2294 (both resonators) |
| P2 |  | 2233 |
| S3 |  | 2521 |
| P3 |  | 2230 |
| S4 |  | 2269 |

FIG. 7 shows that, in the frequency band of about 2350 MHz to about 2360 MHz, which is the receive frequency band of Band 30, the third-order intermodulation distortion in the transmit filter circuit 10A of the second preferred embodiment is reduced to be lower than that in the first preferred embodiment by about 5 dB to about 8 dB.

A modified example, which may be combined with the first and second preferred embodiments as described below, will be discussed below as a first modified example. The capacitance of the series arm resonator S1 located closest to the output terminal T3 may be set to be smaller than that of the second closest series arm resonator S2. Typically, when the capacitance of a resonator is small, the impedance is increased. The capacitance of the series arm resonator S1 that is the closest to the output terminal T3 is relatively small, and the impedance in the frequency band of interference waves to be attenuated is elevated to inhibit the interference waves from entering the transmit filter circuit, as in the first preferred embodiment. If the series arm resonator S2 and/or the series arm resonator S1 are divided into multiple resonators, the total capacitance of the divided multiple resonators is set to satisfy the above-described capacitance magnitude relationship.

Figure 8:
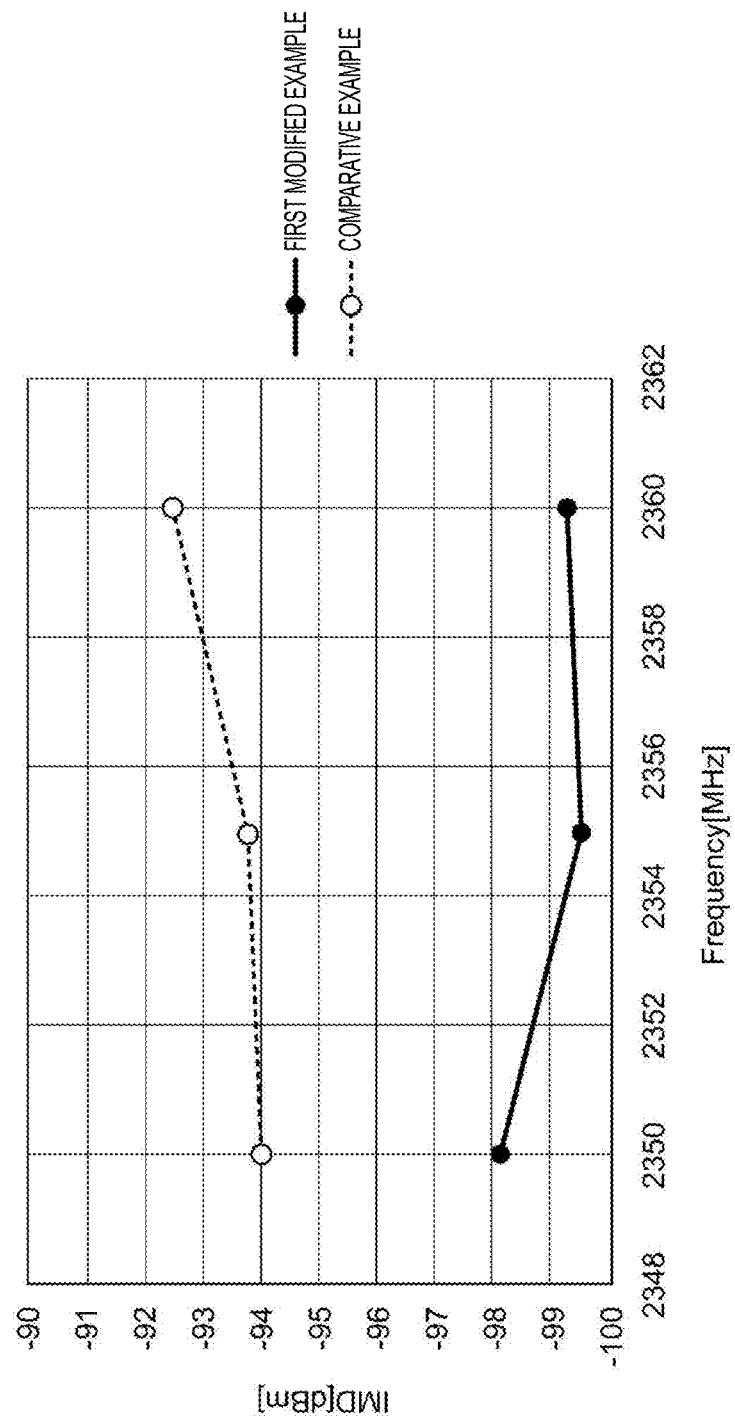
FIG. 8 is a graph showing a simulation result of the occurrence of third-order intermodulation distortion in a transmit filter circuit of a first modified example of a preferred embodiment of the present invention and that of a comparative example.

FIG. 8 is a graph showing a simulation result of the occurrence of third-order intermodulation distortion in the transmit filter circuit of the first modified example and that of a comparative example. The comparative example and the conditions in this simulation are similar to those in the simulation shown in FIG. 4. In the first modified example, the resonant frequencies of the individual resonators are similar to those in the comparative example, and the capacitance of the series arm resonator S1 is smaller than that of the series arm resonator S2.

FIG. 8 shows that, in the frequency band of about 2350 MHz to about 2360 MHz, which is the receive frequency band of Band 30, the third-order intermodulation distortion in the transmit filter circuit of the first modified example is reduced to be lower than that in the comparative example by about 4 dB to about 7 dB.

Figure 9:
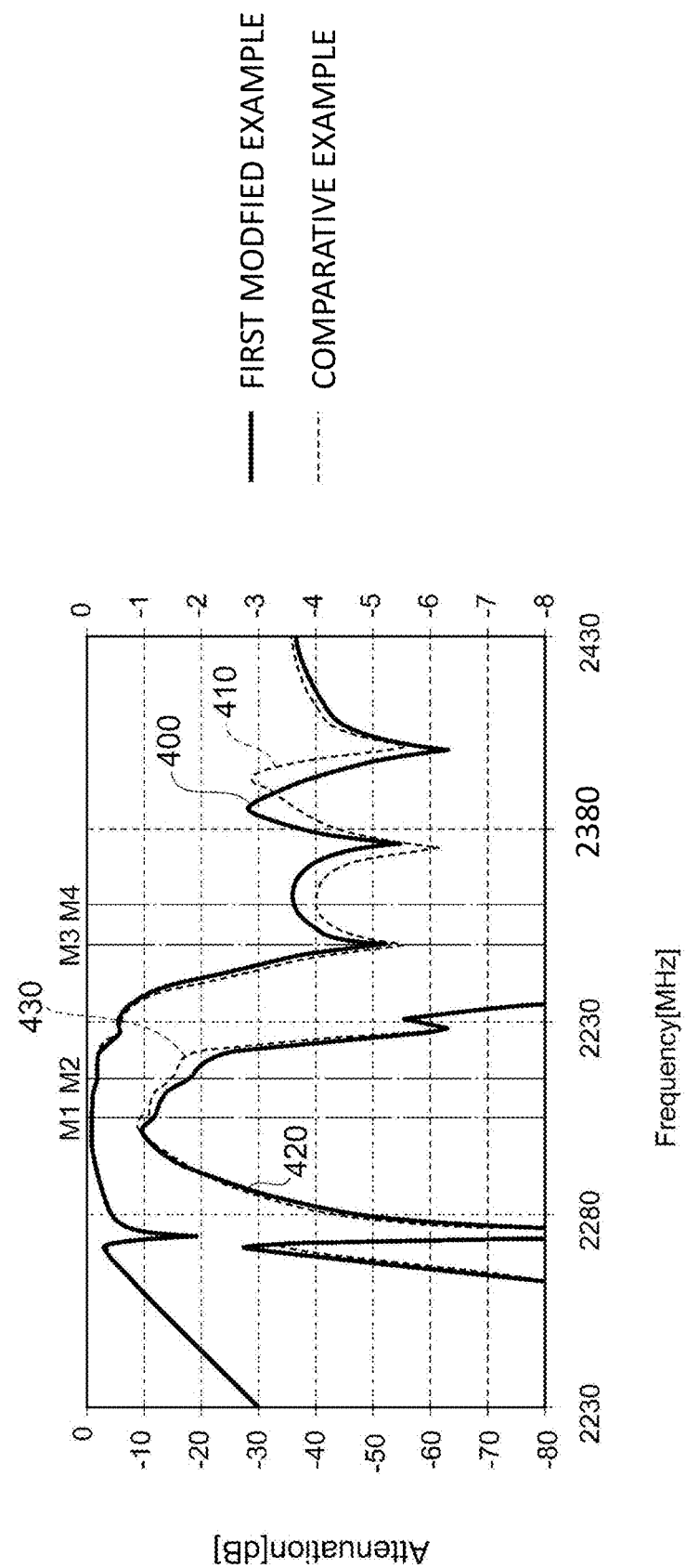
FIG. 9 is a graph showing a simulation result of attenuation characteristics of the transmit filter circuit of the first modified example and that of the comparative example.

FIG. 9 is a graph showing a simulation result of the attenuation characteristics of the transmit filter circuit of the first modified example and that of the comparative example. The conditions in this simulation are similar to those in the simulation shown in FIG. 8. In the graph of FIG. 9, attenuation characteristics 400 and 410 respectively represent the result of the first modified example and that of the comparative example in units of 10 dB (see the scale on the vertical axis on the left side of the graph). Attenuation characteristics 420 and 430 respectively represent the result of the first modified example and that of the comparative example in units of 1 dB (see the scale on the vertical axis on the right side of the graph).

As seen from FIG. 9, in the transmit frequency band, which is the pass band, although a slightly greater loss is observed in the transmit filter circuit of the first modified example than that in the comparative example especially in the higher frequency side, there is no considerable difference in the characteristics between the first modified example and the comparative example, as in the first preferred embodiment.

Accordingly, setting the capacitance of the series arm resonator S1 to be smaller than that of the series arm resonator S2 is also able to regulate the occurrence of third-order intermodulation distortion. In the first modified example, the resonant frequency of the series arm resonator S1 may be higher than that of the series arm resonator S2, or vice versa.

A modified example, which may be combined with the first and second preferred embodiments and the first modified example as described below, will be discussed below as a second modified example. The capacitance of the parallel arm resonator P1, which is located closest to the output terminal T3 among the parallel arm resonators P1 through P3, may be set to be larger than that of each of the series arm resonators S1 and S2, which are the first and second resonators from the output terminal T3. Typically, when the capacitance of a resonator is large, the impedance is decreased. The capacitance of the parallel arm resonator P1 is relatively large, and the impedance in the frequency band of interference waves to be attenuated is reduced to facilitate output of the interference waves to a ground. Accordingly, the interference waves are able to be further inhibited from entering the transmit filter circuit 10 or 10A and the occurrence of third-order intermodulation distortion is able to be regulated.

The circuitry discussed in the first and second modified examples, in which the occurrence of third-order intermodulation distortion is regulated by adjusting the capacitances of the resonators, may be implemented in a mode which is not combined with the first and second preferred embodiments.

The present invention has been described above with reference to preferred embodiments. Each of the transmit filter circuits 10 and 10A includes the input terminal T1, the output terminal T3, plural series arm resonators, and a parallel arm resonator. A transmit signal is supplied to the input terminal T1. The output terminal T3 is electrically connected to the antenna 30. The plural series arm resonators are electrically connected in series with each other on the line U1 between the input terminal T1 and the output terminal T3. The plural series arm resonators include first and second series arm resonators. The first series arm resonator is located closest to the output terminal T3. The second series arm resonator is the second closest to the output terminal T3. A first end of the parallel arm resonator is electrically connected to a node between the first and second series arm resonators. A reference potential is supplied to a second end of the parallel arm resonator. The resonant frequency of the first series arm resonator is higher than that of the second series arm resonator. This circuitry is able to significantly attenuate interference waves, which cause the occurrence of third-order intermodulation distortion, in the series arm resonator located closest to the output terminal T3. As a result, the occurrence of third-order intermodulation distortion is able to be regulated. When the frequency band of a transmit signal is lower than that of a received signal, for example, the occurrence of third-order intermodulation distortion in the frequency band of a received signal is able to be regulated.

In the transmit filter circuit 10A, the second series arm resonator is divided into multiple resonators. The multiple resonators divided from the second series arm resonator are more than at least one resonator defining the first series arm resonator. Accordingly, the occurrence of third-order intermodulation distortion is able to be further regulated while the circuit area is not increased to as large as that in the circuitry in which the first series arm resonator located closest to the output terminal T3 is divided.

In each of the transmit filter circuits 10 and 10A, the plural series arm resonators further include a third series arm resonator, which is located closer to the input terminal T1 than the second series arm resonator is. The resonant frequency of the third series arm resonator is higher than that of the first series arm resonator. According to this circuitry, the impedance in the pass band of each of the transmit filter circuits 10 and 10A returns from the inductive state to the capacitive state, and thus impedance matching is able to be provided between the plural series arm resonators. Therefore, the signal return loss is able to be reduced and an increase in the insertion loss of the transmit filter circuits 10 and 10A is able to be regulated.

In each of the transmit filter circuits 10 and 10A, the capacitance of the first series arm resonator may be smaller than that of the second series arm resonator. This circuitry is able to significantly attenuate interference waves in the first series arm resonator located closest to the output terminal T3, thereby regulating the occurrence of third-order intermodulation distortion.

In each of the transmit filter circuits 10 and 10A, the capacitance of the parallel arm resonator may be larger than that of each of the first and second series arm resonators. This circuitry is able to reduce the impedance of the parallel arm resonator in the frequency band of interference waves to be attenuated to facilitate output of the interference waves to a ground. Accordingly, the interference waves are able to be further inhibited from entering the transmit filter circuit 10 or 10A and the occurrence of third-order intermodulation distortion is able to be regulated.

The above-described preferred embodiments are provided for facilitating the understanding of the present invention, but are not intended to be exhaustive or to limit the present invention to the precise configurations disclosed. Modifications and/or improvements may be implemented without departing from the scope and spirit of the present invention, and equivalents of the present invention are also encompassed in the present invention. That is, design changes applied to the preferred embodiments by those skilled in the art are also encompassed in the present invention within the scope and spirit of the present invention. For example, the elements of the preferred embodiments and the positions, materials, conditions, circuitry, and sizes thereof are not restricted to those described in the preferred embodiments and may be changed. The elements of the preferred embodiments may be combined within a technically possible range, and circuitry provided by combining the elements of the preferred embodiments are also encompassed in the invention within the scope and spirit of the invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmit filter circuit comprising:
   an input terminal that receives a transmit signal;
   an output terminal electrically connected to an antenna;
   a plurality of series arm resonators electrically connected in series with each other on a line between the input terminal and the output terminal, the plurality of series arm resonators including first and second series arm resonators, the first series arm resonator being located closest to the output terminal, the second series arm resonator being second closest to the output terminal; and
   a first parallel arm resonator, a first end of the first parallel arm resonator being electrically connected to a node between the first and second series arm resonators, and a reference potential being provided to a second end of the first parallel arm resonator; wherein
   a resonant frequency of the first series arm resonator is higher than a resonant frequency of the second series arm resonators;
   the plurality of series arm resonators include at least four series arm resonators including the first and second series arm resonators; and
   of the at least four series arm resonators, the second series arm resonator is divided into a plurality of resonators, the plurality of resonators divided from the second series arm resonator being greater in number than a number of at least one resonator defining the first series arm resonator.

2. The transmit filter circuit according to claim 1, wherein the at least four series arm resonators further include a third series arm resonator, the third series arm resonator being located closer to the input terminal than the second series arm resonator is; and
   a resonant frequency of the third series arm resonator is higher than the resonant frequency of the first series arm resonator.

3. The transmit filter circuit according to claim 2, wherein a capacitance of the first series arm resonator is smaller than a capacitance of the second series arm resonator.

4. The transmit filter circuit according to claim 2, wherein a capacitance of the first parallel arm resonator is larger than a capacitance of each of the first and second series arm resonators.

5. The transmit filter according to claim 2, wherein the plurality of resonators divided from the second series arm resonator is greater in number than a number of at least one resonator defining the third series arm resonator.

6. The transmit filter according to claim 5, wherein the at least four series arm resonators further include a fourth series arm resonator, the fourth series arm resonator being located closer to the input terminal than the third series arm resonator; and
   the plurality of resonators divided from the second series arm resonator is greater in number than a number of at least one resonator defining the fourth series arm resonator.

7. The transmit filter according to claim 6, further comprising:
   a second parallel arm resonator, a first end of the second parallel arm resonator being electrically connected to a node between the second and third series arm resonators, and a reference potential being provided to a second end of the second parallel arm resonator; and
   a third parallel arm resonator, a first end of the third parallel arm resonator being electrically connected to a node between the third and fourth series arm resonators, and a reference potential being provided to a second end of the third parallel arm resonator; wherein
   the plurality of resonators divided from the second series arm resonator is greater in number than a number of at least one resonator defining the first parallel arm resonator, the second parallel arm resonator, and the third parallel arm resonator, respectively.

8. The transmit filter circuit according to claim 1, wherein a capacitance of the first series arm resonator is smaller than a capacitance of the second series arm resonator.

9. The transmit filter circuit according to claim 8, wherein
the at least four series arm resonators further include a third series arm resonator, the third series arm resonator being located closer to the input terminal than the second series arm resonator is; and
a resonant frequency of the third series arm resonator is higher than the resonant frequency of the first series arm resonator.

10. The transmit filter circuit according to claim 1, wherein a capacitance of the first parallel arm resonator is larger than a capacitance of each of the first and second series arm resonators.

11. The transmit filter circuit according to claim 10, wherein a capacitance of the first series arm resonator is smaller than a capacitance of the second series arm resonator.

12. A composite filter device comprising:
the transmit filter circuit according to claim 1; and
a receive filter circuit; wherein
an input terminal of the receive filter circuit is electrically connected to the antenna.

13. The composite filter device according to claim 12, wherein a frequency of a received signal provided to the receive filter circuit is higher than a frequency of the transmit signal.

14. The composite filter device according to claim 12, wherein the receive filter circuit includes an output terminal that outputs a received signal of a predetermined frequency band.

15. The composite filter device according to claim 12, wherein a pass band of the transmit filter circuit is different from a pass band of the receive filter circuit.

16. The composite filter device according to claim 12, wherein the receive filter circuit includes a longitudinally coupled resonator.

17. The transmit filter circuit according to claim 1, wherein the reference potential is a ground potential.

18. The transmit filter circuit according to claim 1, wherein each of the plurality of series arm resonators and the first parallel arm resonator is a surface acoustic wave (SAW) filter, a piezoelectric thin-film resonator filter, or a bulk acoustic wave (BAW) filter.

19. The transmit filter circuit according to claim 1, wherein the transmit signal is a signal of long term evolution (LTE) Band 1.

20. The transmit filter circuit according to claim 1, wherein at least one of the plurality of series arm resonators and the first parallel arm resonator includes an interdigital transducer (IDT).

21. The transmit filter circuit according to claim 20, wherein a resonant frequency of the at least one of the plurality of series arm resonators and the first parallel arm resonator is determined by a pitch of the IDT.

22. The transmit filter circuit according to claim 1, wherein an impedance of the first series arm resonator is higher than an impedance of the second series arm resonator.

23. The transmit filter according to claim 1, wherein the first series arm resonator is divided into a plurality of resonators.

24. The transmit filter according to claim 1, wherein the plurality of resonators divided from the second series arm resonator is greater in number than a number of at least one resonator defining each of series arm resonators other than the first series arm resonator of the plurality of the series arm resonators.

* * * * *